United States Patent [19]

Fan

[11] Patent Number: 4,572,764
[45] Date of Patent: Feb. 25, 1986

[54] PREPARATION OF PHOTOFORMED PLASTIC MULTISTRATE BY VIA FORMATION FIRST

[75] Inventor: Roxy N. Fan, E. Brunswick, N.J.

[73] Assignee: E. I. Du Pont De Nemours and Company, Wilmington, Del.

[21] Appl. No.: 681,189

[22] Filed: Dec. 13, 1984

[51] Int. Cl.[4] .................. B44C 1/22; B29C 17/08; G03C 5/00; B05D 5/12
[52] U.S. Cl. .................................. 156/630; 29/846; 29/852; 29/874; 156/644; 156/652; 156/655; 156/902; 156/235; 156/247; 156/280; 156/272.2; 427/54.1; 427/96; 427/97; 427/98; 430/312; 430/313; 430/315
[58] Field of Search ............... 156/629, 630, 644, 652, 156/655, 659.1, 668, 902, 272.2, 280, 235, 247; 29/846, 874, 852; 174/68.5; 427/43.1, 54.1, 96–98; 430/312, 313, 315

[56] References Cited

U.S. PATENT DOCUMENTS 4,157,407 6/1979 Peiffer ............................ 427/54
4,469,777 9/1984 O'Neil .......................... 156/659.1 X

*Primary Examiner*—William A. Powell

[57] ABSTRACT

Process for preparing multilayer printed circuits comprising laminating to a substrate bearing a circuit pattern or electrically conductive surface a photosensitive layer which is tacky or becomes tacky upon exposure; exposing the laminate to actinic radiation through a via image related to the underlying circuit pattern, if present; optionally removing the removable via image of the photosensitive layer in either the exposed or unexposed areas, e.g., with a solvent or peeling apart by removal of a cover sheet, if present; laminating to the remaining tacky photosensitive layer a layer of a second photosensitive composition; exposing the laminate to actinic radiation through a registered image pattern of at least one overlying segment of the via image area and conductive circuit pattern to form an image surface having nontacky areas and removable circuit image areas; removing the removable circuit image areas of the photosensitive layer in the exposed or unexposed areas with a solvent therefor, or peeling apart by means of a cover sheet, if present, the removable via image areas of the lower photosensitive, if present, are removed by a solvent therefor; embedding finely divided material, e.g., copper, into the tacky areas; optionally curing the laminate by means of actinic radiation and/or heat; plating electrolessly to form an interconnected electrically conductive circuit. Additional circuit layers can be added.

28 Claims, 8 Drawing Figures

PREPARATION OF PHOTOFORMED PLASTIC MULTISTRATE BY VIA FORMATION FIRST

TECHNICAL FIELD

This invention relates to a process for preparing multilayer printed circuits. More particularly this invention relates to a process for preparing multilayer printed circuits from at least two photosensitive layers whereby via formation occurs first.

BACKGROUND ART

The preparation of printed circuits, including multilayer printed circuits is known. Powdered materials such as particulate metals have been applied to surfaces having imagewise tacky and nontacky areas by a number of toning methods to produce printed circuit patterns. Representative methods are disclosed in Peiffer U.S. Pat. Nos. 4,054,479, 4,054,483 and 4,157,407. After the particulate metal is applied to the tacky image areas and unwanted particles are removed, e.g., mechanically, from the nontacky image areas, the circuit is formed by one of several additive techniques including fusion of metal particles, electroless plating, etc. The printed circuits formed by these additive processes are useful, but the processes have certain disadvantages.

Peiffer U.S. Pat. No. 4,157,407 is an improvement over the earlier Peiffer U.S. Pat. Nos. 4,054,479 and 4,054,483 wherein conductive interconnections between layers are produced by predrilling holes and registering the holes with the printed circuit patterns. Such predrilling procedures are limited by inherent inaccuracies of registration to printed circuit patterns where circuit lines are not closely spaced. Peiffer U.S. Pat. No. 4,157,407 describes a process for preparing printed circuits wherein a single layer of a photoadhesive, e.g., photopolymerizable composition, is applied to a substrate bearing an electrically conductive circuit pattern. The photoadhesive layer in order to be suitable for the preparation of a printed circuit must be capable of toning in tacky areas without toning in the background areas. The photoadhesive layer also must possess good development latitude with a solvent therefor, adhere metal powder on its vias, and maintain adherence to its substrate through all the steps of preparing a circuit including solvent development and plating. It is difficult to formulate an element having a single photoadhesive layer which provides good properties under all conditions in preparing the printed circuit.

A method of making printed circuits utilizes two exposures of a photopolymerizable element, the first exposure, with a protective film present, defines a circuit pattern; the second exposure, without a protective film present, defines vias. After the first exposure metal powder, e.g., copper, is applied to the circuit pattern. During the second exposure oxygen inhibition is overcome by a gaseous purge, e.g., nitrogen. The amount of metal powder, uniformity of application, and particle size can affect the via exposure level because the exposure wherein the vias are formed takes place after application of the metal powder. If there is insufficient or an uneven gaseous purge during the second exposure, the vias may be poorly reproduced or a loss of metal powder may occur during liquid development.

There is a need for a process for preparing multilayer printed circuits which are insensitive to the exposure environment and properties of the finely divided material, and in their preparation do not undergo loss of the finely divided material due to development.

BRIEF DESCRIPTION OF THE DRAWING

In the accompanying Figures forming a material part of this disclosure wherein the Figures are a schematic view in cross section of a photosensitive element.

DISCLOSURE OF THE INVENTION

Figure 1A:
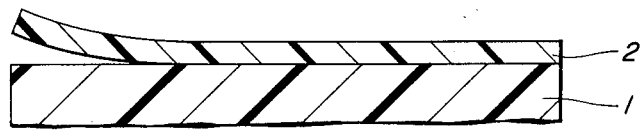
FIG. 1A illustrates the lamination to a substrate (1), bearing a circuit pattern (not shown) or having an electrically conductive surface, a photosensitive layer (2), optionally having a removable cover sheet (not shown).

In accordance with this invention there is provided a process for preparing a multilayer printed circuit having conductive interconnections which comprises:
(a) laminating to a substrate bearing an electrically conductive surface or circuit pattern a layer of a photosensitive composition which is tacky or becomes tacky upon exposure, the layer optionally having a removable cover sheet;
(b) exposing the laminate to actinic radiation through a via image which is related to the underlying circuit pattern if present leaving removable via image areas overlying at least one segment of the underlying conductive circuit pattern;
(c) optionally removing the removable via image areas of the photosensitive layer in either the exposed or unexposed areas with a solvent therefor or peeling apart by removal of the cover sheet, if present;
(d) laminating to the tacky photosensitive layer remaining from step (b) or step (c) a layer of a second photosensitive composition, the layer optionally having a removable cover sheet;
(e) exposing the laminate of step (d) to actinic radiation through a registered circuit image pattern which is related to the underlying circuit pattern having at least one segment thereof overlying at least one segment of the via image area resulting from step (b) and the underlying conductive circuit pattern to form an image surface having nontacky areas and removable circuit image areas;

(f) removing the removable circuit image areas of the photosensitive layer of step (d) in either the exposed or unexposed areas with a solvent therefor, or peeling apart by removal of the cover sheet, if present;

(g) removing the removable via image areas of the lower photosensitive layer, if present, with a solvent therefor;

(h) embedding finely divided metal, alloy, or plating catalyst material to the tacky image areas;

(i) optionally curing the laminate by exposing the laminate to actinic radiation, and/or heating;

(j) plating electrolessly the metallized or catalyzed vias, the uncovered segments, and overlying circuit image to form an electrically conductive circuit pattern interconnected with electrically conductive vias.

A multilayer printed circuit board having conductive interconnections can be prepared from a two layer printed circuit which has been prepared utilizing steps (a), (b), (d), (e), (f), (g), (h) and (j) as described above and either or both of the optional steps (c) and (i) and then repeating the required steps as well as any of the optional steps at least once using the newly plated circuit pattern in step (j) for the succeeding process step (a).

The two photosensitive layers described below in the specification are illustrated by photopolymerizable type compositions, i.e., those which harden in the exposed image areas. The invention, however, is not limited to the use of photopolymerizable layers or compositions. One or more of such layers can be prepared from other photosensitive compositions, e.g., photocrosslinkable, photosolubilizable, phototackifiable, photodesensitizable compositions, or combinations thereof, which are either positive-working or negative-working. These systems are disclosed generally in Kosar, Light Sensitive Systems, Wiley and Sons, New York, Chapters 4 to 6, 1965. Other useful photosensitive compositions can be exemplified as follows: photocrosslinkable compositions of Celeste U.S. Pat. No. 3,526,504; photosolubilizable compositions of Roos U.S. Pat. Nos. 3,778,270 and 3,837,860; phototackifiable compositions of Pilz U.S. Pat. No. 4,181,531, Abele and Grossa U.S. Pat. No. 4,243,741, Abele U.S. Pat. No. 4,346,162, and Abele U.S. Pat. No. 4,358,529; and photodesensitizable compositions of Nebe U.S. Pat. No. 4,029,505 and Pazo U.S. Pat. No. 4,198,242. These United States patents are incorporated herein by reference.

The printed circuit substrate employed in the present invention can be any one of the various kinds of sheets, plates, synthetic resin plates, synthetic resin laminated plates, or composites, etc., having the necessary electrical and mechanical properties, chemical resistance, heat resistance, etc. Examples of resins include: phenol-formaldehyde, epoxy and melamine resins, etc. Glass plates and ceramic or ceramic coated metal plates are also useful. The substrate can also be a paper, cardboard, fiber, including glass cloth, wooden sheet material or paper base phenolic resin laminate. Paper base without resin is particularly useful in producing low-cost printed circuits. Metal sheets can be used provided that the material adhered thereto acts as an insulating barrier between the metal sheet support and the buildup metallized circuit. Also useful are self-supported photohardenable elements as disclosed in Peiffer U.S. Pat. No. 4,054,479. The printed circuit substrate can have on its surface a conductive metal layer, e.g., copper, which is often referred to as a ground plane. A printed circuit pattern which can contain closely spaced lines can be present on the printed circuit substrate. The printed circuit pattern can be prepared by standard methods known in the art, e.g., etching of copper on the surface of the substrate or by other methods such as those described in Peiffer U.S. Pat. No. 4,234,626 and Haney and Lott U.S. Pat. No. 4,411,980.

To form printed circuit boards with conductive interconnections according to the invention to the printed circuit substrate bearing a circuit pattern or having an electrically conductive surface (ground plane) are laminated two photopolymerizable layers. The laminations, as described above, are sequential, the second lamination following imagewise exposure of the first laminate to actinic radiation through a via image which may be related to an underlying circuit pattern and optionally removing the unexposed areas of the first-laminated photopolymerizable layer. The laminations can be done at elevated temperature provided the temperature is below the degradation temperature of the particular photopolymerizable layers. Lamination procedures are described in Celeste U.S. Pat. No. 3,469,982, Collier and Pilette U.S. Pat. No. 3,984,244 and Friel U.S. Pat. No. 4,127,436. These patents are incorporated herein by reference. The two layers range in thickness from 0.00005 to 0.005 inch (0.0013 to 0.13 mm) for the upper layer and 0.0005 to 0.010 inch (0.013 to 0.254 mm) for the lower layer adhered to the printed circuit board. The combined thicknesses of the two layers preferably is between about 0.00055 to 0.015 inch (0.014 to 0.381 mm). Prior to lamination the photopolymerizable layers are present between a removable film support and a removable protective cover sheet. The film support, e.g., polyethylene terephthalate, polyimides, etc., have either low to moderate adherence to the photopolymerizable layer and can be removed, e.g., at normal room temperature, without damaging the layer, or can be treated, e.g., electron discharge treated, etc. to facilitate adhesion, if necessary. The photopolymerizable layer has less adherence to the protective cover sheet than it does to the removable film support. At least a portion of the photopolymerizable layer has less adherence to the removable film support than it has to the surface to which it is applied, i.e., printed circuit substrate. Typical protective cover sheets include: polyolefins, silicone-treated polyethylene terephthalate, fluoronated polymeric materials, etc.

The two photopolymerizable layers differ in their composition so as to provide different desired properties. The upper (top) layer is formulated to provide improved surface response. "Surface response" as used through the specification means substantially no toner or catalyst material adheres to the surface of the upper layer. Good fine line resolution is achieved with good edge definition. The lower layer is formulated to provide improved bulk response. "Bulk response" as used throughout the specification means good solvent development latitude, good toner acceptance on the via walls (including after exposure and development), good adhesion to the printed circuit substrate, and good electrical and thermal properties as a permanent dielectric layer. Each photopolymerizable layer contains the normal ingredients of a photopolymerizable composition, i.e., polymeric binder, ethylenically unsaturated compound and photoinitiator or photoinitiator system. The differences in composition and weight percentages are discussed more fully below. Optical brighteners, fillers, colorants, etc. are optional additives that can be present.

The upper photopolymerizable layer, in order to provide proper surface response, has an optical density in at least a portion of the actinic spectral region in the range of 0.3 to 1.5, preferably about 0.9, contains about 10 to 90 percent by weight monomer or mixture of monomers which may be the same or different from the monomer present in the lower layer (1); contains the same or different initiator or initiator system present in the lower layer (1); and contains no elastomeric binder(s). Suitable monomeric compounds include those compounds disclosed in Fickes and Rakoczy U.S. Pat. No. 4,400,460, column 3, line 48 to column 5, line 4, and Haney and Lott U.S. Pat. No. 4,411,980, column 4, lines 10 to 65. The disclosures of these patents and the patents cited therein are incorporated herein by reference. Non-elastomeric polymer binders generally having a Tg above 15° C., preferably above 25° C. (10 to 90 percent by weight) include those compounds disclosed in Haney and Lott U.S. Pat. No. 4,411,980, column 5, line 46 to column 6, line 7, the disclosure of which is incorporated herein by reference. The photoinitiator or photoinitiator system (0.2 to 10 percent by weight) includes any of those compounds disclosed in Notley U.S. Pat. No. 2,951,752, Chambers U.S. Pat. No. 3,479,185, Chang and Fan U.S. Pat. No. 3,549,367, Fan U.S. Pat. No. 3,558,322, Cescon U.S. Pat. No. 3,615,454, Grubb U.S. Pat. No. 3,647,467, Baum and Henry U.S. Pat. No. 3,652,275, Chang U.S. Pat. No. 3,661,558, Strilko U.S. Pat. No. 3,697,280, Chang U.S. Pat. No. 3,926,643, Dessauer U.S. Pat. No. 4,311,783, Sysak U.S. Pat. No. 4,341,860, etc. To provide the requisite optical density, ultraviolet absorbers, ultraviolet brighteners, initiators with absorption in the ultraviolet region of the spectrum or colorants can be present in the upper layer as known to those skilled in the art. The percentages by weight are based on the total weight of the upper layer.

The lower photopolymerizable layer (1), in order to provide proper bulk response, contains at least one elastomeric or rubber filled binder having a Tg of −10° C. or lower, or impact modifier which renders the lower layer adherent to toner or catalyst material (unexposed as well as exposed areas); and contains at least one monomeric compound such as highly viscous "glass-like" monomers, e.g., modified epoxy diacrylate or dimethacrylate resins, and the other monomers disclosed in Fickes and Rakoczy U.S. Pat. No. 4,400,460 and Haney and Lott U.S. Pat. No. 4,411,980, the disclosures of which are incorporated herein by reference. Elastomeric polymeric binders present in the lower layer include: rubber type polymers, both natural and synthetic, e.g., polyisobutylene, Thiokol A, butyl rubber, chlorinated rubbers, poly(vinylisobutylether), polymers of butadiene, isoprene and random, teleblock and block copolymers, terpolymers or higher polymers, e.g., butadiene copolymerized with styrene, isoprene, neoprene and acrylonitrile, nitrile rubbers, e.g., butadiene/acrylonitrile, acrylonitrile/butadiene carboxy-modified, acrylonitrile/butadiene/styrene, alkyl (1 to 4 carbon atoms) acrylate or methacrylate/acrylonitrile/butadiene interpolymers, silicone elastomers, acrylic containing elastomers, etc. in various proportions. The lower layer (1) contains 0.2 to 10 percent by weight of an initiator or initiator system disclosed in any of the above-listed United States patents described as initiators or initiator systems for upper layer (2). The ratio of monomeric compound to elastomeric binder is dependent on several factors including the types of monomeric compounds and elastomeric binders used and the molecular weights, particularly of the binder. The percentages by weight are based on the total weight of the lower layer.

Optical brighteners which can be present in the photopolymerizable compositions are disclosed in Held U.S. Pat. No. 3,854,950, column 2, line 67 to column 3, line 41 and column 4, lines 25 to 42, the disclosures of which are incorporated herein by reference. Fillers which can be present in the bulk response photopolymerizable compositions are disclosed in Celeste and Bauer U.S. Pat. No. 3,261,696, column 4, lines 43 to 52, and Cohen and Lazaridis U.S. Pat. No. 4,414,278, the disclosures of which are incorporated herein by reference.

The lower bulk response layer (after lamination to the substrate as described above) is exposed to a source of actinic radiation through a via image which is related to an underlying circuit pattern if one is present leaving removable via image areas overlying at least one segment of the underlying conductive circuit pattern. The removable areas of the photopolymerizable layer can be optionally removed by liquid development, e.g., with a solvent therefor, or by peeling apart the cover sheet with the removable via image areas of the photopolymerized layer to form vias having side walls. The upper surface response layer is then laminated to the bulk response layer remaining, and the two layer laminate is exposed to a source of actinic radiation through a registered circuit image pattern which is related to the underlying circuit pattern having at least one segment thereof overlying at least one segment of the via image areas and the conductive circuit pattern. After the second exposure, the removable areas of the photopolymerizable upper layer are removed with a solvent therefor or either the exposed or unexposed areas are removed by peeling off the cover sheet as described above. In the event that unexposed areas of the lower photopolymerizable layer still remain, the unexposed areas are then removed with a solvent therefor.

The source providing actinic radiation for imagewise exposure are known to those skilled in the art and are rich in ultraviolet radiation. Suitable sources are disclosed in Plambeck U.S. Pat. No. 2,760,863, Chu and Cohen U.S. Pat. No. 3,649,268, Peiffer U.S. Pat. No. 4,157,407 and Haney and Lott U.S. Pat. No. 4,411,980, the disclosures of which are incorporated by reference. Another source of actinic radiation is a Tamarack ®152R Exposure Unit, 1000-watt collimated mercury arc.

When the imaged layers are developed with liquid, preferably a single solvent is used to remove image areas in both layers, but if necessary, two different solvents, one for each layer may be used. Typical solvents include: 1,1,1-trichloroethane, perchloroethylene, perchloroethylene and n-butanol, 1,1,1-trichloroethane and n-butanol, butyl and ethyl Cellosolve ®, butyl Carbitol ® and 1,1,1-trichloroethane and derivatives thereof, various alcohols, e.g., methanol, ethanol, propanol, isopropanol, etc. and 1,1,1-trichloroethane, etc. These and other useful solvents, e.g., aqueous alkaline or semi-aqueous developers, are described in the patents which disclose the particular photopolymerizable compositions. In place of one or both of the solvent developments, peel apart development can be used whereby either exposed or unexposed image areas are removed by forcefully peeling apart the cover sheet present on the particular photopolymerizable layer. The procedure for peeling apart and peel apart elements are described in Cohen and Fan U.S. Pat. No. 4,174,216, the disclosure of which is incorporated herein by reference (see in particular column 3, lines 23 to 47 of U.S. Pat. No. 4,174,216). Additional peel apart processes and elements are disclosed in Celeste U.S. Pat. No. 3,770,438, Kuchta U.S. Pat. No. 3,785,817 and Cohen and Gervay U.S. Pat. No. 4,289,841, the disclosures of which are incorporated hereby by reference. When using a peel apart technique, it is preferred that at least the exposed or unexposed areas of the thin upper photopolymerizable layer be peeled from the lower photopolymerizable layer.

After all the undesired areas of the photopolymerizable layers are removed, finely divided metal, alloy, or plating catalyst is applied to the tacky image areas and via walls and becomes embedded therein. This is done generally by applying, e.g., with pressure, the metal or plating catalyst particles over the entire exposed surface including vias and removing any of the particles remaining or present in the nonadherent or nontacky areas. Suitable particles include: copper, tin, lead, solder, mixtures of copper and solder, copper-tin alloy, tin-lead alloy, aluminum, gold, silver; metal oxides such as titanous oxide, copper oxide, etc. Also useful are metal coated particles, e.g., silver coated glass. The particles have an average diameter of 0.5 to 250 μm, preferably 1.0 to 25 μm, in average diameter. Copper powder is preferred.

The particles can be applied (embedded) by known methods including, but not limited to, the toning methods described in Burg and Cohen U.S. Pat. No. 3,060,024, Chu and Cohen U.S. Pat. No. 3,649,268 and Tobias U.S. Pat. No. 4,069,791. It is also possible to apply the particles by use of a fluidized bed of particles as described in Research Disclosure, June 1977, No. 15882 by Peiffer and Woodruff. Optionally the adherence of the particles to the image surface may be improved by tackifying the image areas, e.g., by heat from an infrared heater. This may be accomplished during the application of the particles. Removal of excess metal, alloy or plating catalyst particles from nonadherent areas, if necessary, is described in the above-identified United States patents and the Research Disclosure, the disclosures of which are incorporated herein by reference.

At this time another optional step but one which is preferably used is the curing of the circuit board by exposing the circuit board to overall ultraviolet radiation, e.g., from a radiation source as described above or other ultraviolet radiation curing unit, e.g., in the range of 0.1 to 10 minutes, and/or by heating, e.g., at a temperature up to 150° C. for at least 10 seconds. The curing step, when used, can occur simultaneously with the application of the metal, alloy or plating catalyst particles and/or subsequent thereto. It is important that the duration and/or temperature used in the curing step be limited to prevent any substantial degradation of the photopolymerized element.

Two additional embodiments of the invention are disclosed in Examples 7 and 8 wherein the application of finely divided metal, alloy or plating catalyst is applied at room temperature to a laminate wherein an intermediate elastomeric layer is present between the lower and upper layers described above. The intermediate layer is particularly useful in a laminate to which metal or plating catalyst particle application at elevated temperature is not desirable. The intermediate layer enables the laminate to be effectively toned at normal room temperature. Example 7 illustrates a solvent development (intermediate layer present during exposure through via target) and Example 8 a wet development and a peel apart development (intermediate layer laminated after vias formed by exposure and solvent development).

Electroless plating procedures are known to those skilled in the art, e.g., U.S. Pat. No. 4,054,483 which is incorporated herein by reference. Electroless plating baths are commercially available, e.g., from the Shipley Company, Revere, MA, Kollmorgen Corp., Glen Cove, N.Y., and other sources. The metal-bearing circuit board is maintained in the bath for a sufficient period of time, e.g., 1 to 6 hours, preferably 1 to 4 hours wherein the metallized or catalyzed vias, the uncovered segments and overlying circuit image is electrolessly plated to form the electrically conductive circuit interconnected with electrically conductive vias. Useful electroless plating solutions are described in the examples below, Zeblisky et al., U.S. Pat. No. 3,095,309, particularly Example II, which is incorporated herein by reference. The temperature of the electroless plating bath can range from 43° to 85° C., preferably 53° C.

A preferred embodiment of the invention is illustrated in Example 1 below.

INDUSTRIAL APPLICABILITY

The process of the invention enables two or more layered printed circuits with electrical interconnections to be prepared without drilling or punching the requisite hole and without chemical catalyzation of the through-holes which is time consuming. The printed circuits are prepared with substantially no extraneous plating in the background areas. There is provided by the process a wider latitude for formulation of the circuits due to the separation of the surface response (no background toner) of the upper photosensitive layer from the bulk response of the lower photosensitive layer (development latitude for via formation, toner acceptance for exposed and developed via walls, and physical properties). The process of the invention is insensitive to the exposure environment and is versatile with respect to the finely divided metal, alloy or plating catalyst material that can be used.

EXAMPLES

This invention is illustrated by the following examples wherein the parts and percentages are by weight. The molecular weights of polymeric compounds are weight average molecular weights ($\overline{M}_w$). The $\overline{M}_w$ of the polymer can be determined by using a light scattering technique using known standard sample, e.g., polystyrene, polymethacrylic acid, polymethylmethacrylate, etc., as known to those skilled in the art.

EXAMPLE 1

A double-sided copper printed circuit laminate (1 ounce (2.8 g) copper on each side) referred to in the trade as a ground plane was cut to the size 6 inch×6 inch (15.2 cm×15.2 cm) and the copper surfaces on both sides were mechanically scrubbed with a Somaca®LD printed circuit brush (trademark 3M Co., St. Paul, MN). The scrubbed circuit board was immersed in a solution prepared as follows:
 (a) to 2500 g distilled water,
 (b) add concentrated hydrochloric acid, 380 g,
 (c) add benzotriazole, 376.6 g, and (d) bring total to 3800 g with distilled water, and then
(e) dilute 1 part to 9 parts of distilled water. The treated circuit board was placed in a rinse water tank for 3 minutes followed by rinsing the board for about 30 seconds with distilled water. After the board was allowed to dry it was baked in an oven for about 15 minutes at 150° C. A polyethylene terephthalate film treated on one side with 16,250 release by Custom Coating and Laminating Corp., Worcester, MA (not shown in FIG. 1A) bearing a photosensitive layer (2 in FIG. 1A), about 0.0020 inch (0.05 mm) in thickness of the below-listed composition was laminated to the baked circuit board (1 in FIG. 1A) at 2 feet/minute (0.61 m/minute) at about 103° C. in a Riston ®HRL-24 Laminator manufactured by E. I. du Pont de Nemours and Company, Wilmington, DE.

| Ingredient | Amount (parts) |
| --- | --- |
| Trimethylolpropane triacrylate | 10.45 |
| Hexamethylene glycol diacrylate | 10.45 |
| Rubber [3% carboxy-modified acrylonitrile(27)/butadiene(73)] high molecular weight, average Mooney viscosity is 45 | 72.90 |
| 2,2-dimethoxy-2-phenyl-acetophenone | 6.00 |
| C.I.S. Red Dye No. 109 | 0.20 |

Figure 1B:
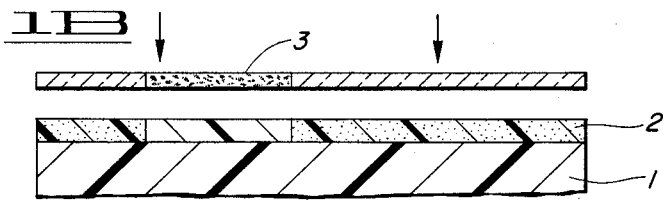
FIG. 1B illustrates exposing the laminate to actinic radiation through an image (3) of at least one overlying segment of the conductive circuit pattern (via target).
Figure 1C:
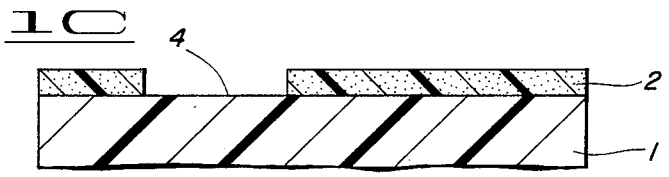
FIG. 1C illustrates the formation of the via (4) (vertical sides only shown) by removal of either the exposed or unexposed area of photosensitive layer (2), e.g., with a solvent therefor or by peeling apart.
Figure 1D:
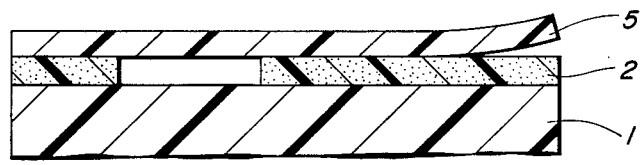
FIG. 1D illustrates the lamination to photosensitive layer (2) remaining from FIG. 1C of a second photosensitive layer (5), optionally having a removable cover sheet (not shown).

The laminate was exposed through a via target (3 in FIG. 1B) for 4 seconds using a Tamarack ®152R Exposure Unit, a 1000-watt collimated mercury arc source and held for 5 minutes before development. The treated polyethylene terephthalate film was removed, and the exposed laminate was developed in a perclene(75)/n-butanol(25) (volume) developer at room temperature for 130 seconds followed by a 30 second tap water rinse and air blown dry. The vias (4 in FIG. 1C) are thereby formed. The dry developed laminate was baked in an oven at 150° C. for 3 minutes to remove residual solvent and then cooled to room temperature. A second photosensitive layer, 0.0003 inch (0.0076 mm) thick of the below-listed composition having a polyethylene terephthalate film, 0.0005 inch (0.013 mm) (not shown in FIG. 1D) was laminated in a Cromalin ®2700 Laminator at 210° F. (~99° C.) and 6 feet (1.83 m)/minute to the baked, developed laminate (5 in FIG. 1D).

| Ingredient | Amount (parts) |
| --- | --- |
| Trimethylolpropane trimethacrylate | 35.6 |
| Polyoxyethylated trimethylol propane triacrylate, ave. mol. wt. 1,000 | 7.9 |
| Polyoxyethylene lauryl ether, mol. wt. 362 | 7.9 |
| Methyl methacrylate resin[1] | 32.40 |
| Vinyl acetate polymer, moderate mol. wt., density 1.19 g/cc | 12.65 |
| (2-o-chlorophenyl-4,5-diphenyl-imidazolyl) dimer | 1.58 |
| 2-mercaptobenzothiazole | 0.80 |
| 2-(Stilbyl-4″)-(naphtho-1′,2′:4,5)-1,2,3-triazole-2″-sulfonic acid phenyl ester | 0.20 |
| 7-(4′-chloro-6′-diethylamino-1′,3′,5′-triazine-4′-yl)amino-3-phenylcoumarin | 0.99 |
| 2,2′-dihyroxyl-4-methoxybenzophenone | 0.08 |
| Hydroquinone | 0.05 |

[1] polymer high molecular weight range, inherent viscosity 1.20 when 0.25 g polymer is dissolved in 50 ml chloroform, measured at 25° C. using a No. 50 Cannon-Fenske viscometer; glass transition temperature (°C.) of 95, Tukon hardness,Knoop No. 19, typical viscosity in toluene, mPa · s (cP) at 25° C. (% solids) is 1.400 (17.5%).

Figure 1E:
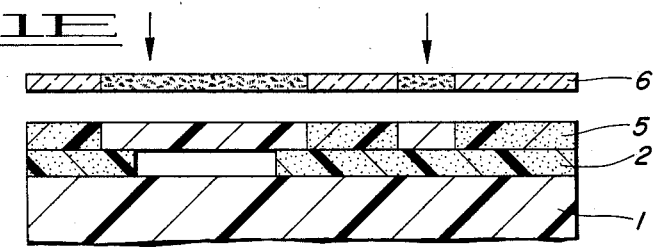
FIG. 1E illustrates exposing the two layer laminate to actinic radiation through a registered circuit image (6) which is related to the underlying circuit pattern.
Figure 1F:
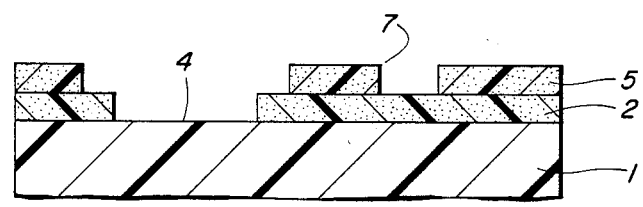
FIG. 1F illustrates the formation of a via (4) and circuit segment (7) by removal of either the exposed or unexposed areas of the photosensitive layer (5), e.g., with a solvent therefor or by peeling apart (vertical sides only of via and segment shown).

The two-layer laminate was exposed for 15 seconds through a positive circuit line image (6 in FIG. 1E) in register with the via using the exposure source described above. The exposed laminate was then held for 5 minutes before development. The treated polyethylene terephthalate film was removed, and the exposed two-layer laminate was developed for 35 seconds at room temperature on Riston ® Model B Processor manufactured by E. I. du Pont de Nemours and Company, Wilmington, DE using methylchloroform. The via (4 in FIG. 1F) and circuit segment (7 in FIG. 1F) were formed by the development. The developed two-layer laminate was air blown dry and baked in an oven at 150° C. for 3 minutes to remove residual solvent.

Figure 1G:
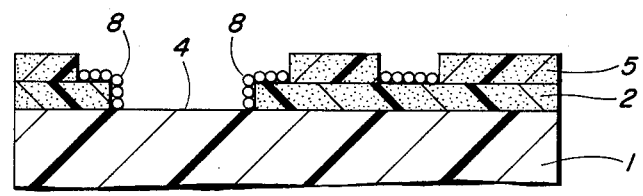
FIG. 1G illustrates the application of finely divided metal, metal alloy, or plating catalyst material (8) adhering to the circuit segment and the side walls of the via (4) (shown only on the vertical side walls).

The developed laminate was pad toned at room temperature for 8 cycles using a mohair pad containing Cerac ® copper powder spherical particles having median size of about 2.85 μm made from atomized melt and surface treated with 0.5% $C_{13}H_{27}(OCH_2CH_2)_5$—OH. Excess copper powder was removed by wiping clean with a wet towel and drying. The copper powder adhered to the circuit segment and sidewalls of the via (8 in FIG. 1G). The laminate was baked in an oven at 150° C. for 3 minutes and then ultraviolet radiation cured using an Argus International PC-7100 Ultraviolet Processor at 10 feet/minute (~3.05 m/minute) speed setting. The cured laminate was baked in an oven at 150° C. for 20 minutes.

Figure 1H:
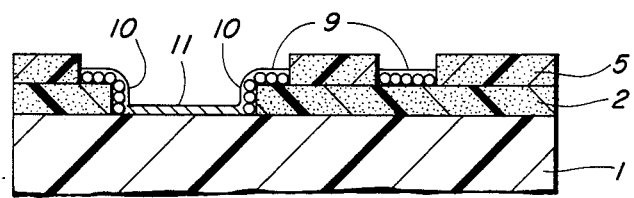
FIG. 1H illustrates plating the metallized or catalyzed circuit segment, via (vertical sides only shown) and underlying surface or circuit pattern to form an electrically conductive circuit pattern (9) interconnected with an electrically conductive via (10) and underlying conductive surface (11).

The cured laminate was degreased by washing with a warm soapy solution of pH about 9 followed by a warm water rinse and the laminate was allowed to cool. The laminate was immersed for 20 seconds into 15% sulfuric acid solution, followed by a rinse in a water tank and a distilled water tank each for 30 seconds. The rinsed laminate was placed immediately into a copper electroless plating bath purchased from Photocircuits Kollmorgen, Glen Cove, N.Y. designated PCK AP-480 (referred to as additive plating bath 480, electroless copper addition technology) and maintained in the plating bath for 2 hours. The electrolessly plated circuit (9 in FIG. 1H) interconnected with an electrically conductive via (10 in FIG. 1G) and underlying conductive surface (11 in FIG. 1G), was rinsed in water for 1 minute, immersed for 3 minutes in the benzotriazole solution described above, rinsed again in water and dried. The circuit was baked for 1 hour at 150° C., cooled and tested. A useful electrically conductive circuit with desired interconnections to the ground plane was obtained.

EXAMPLE 2

Example 1 was repeated except for the following variations:

1. The photosensitive layer laminated to the baked circuit board was of the following composition:

| Ingredient | Amount (parts) |
| --- | --- |
| Rubber described in Ex. 1, | 75.0 |

-continued

| Ingredient | Amount (parts) |
| --- | --- |
| lower layer | |
| Hexamethylene glycol diacrylate | 22.9 |
| Tertiary butyl anthraquinone | 2.0 |
| Monastral Green ® (pigment 30%) rollmill blended with methylmethacrylate(34)/styrene(42)/ acrylonitrile(8)/butadiene(16) interpolymer | 0.1 |

The photosensitive layer was present on a silicone release polyethylene terephthalate film.

2. The single-layer laminate was exposed through the via target for 7 seconds.

3. The development to form the vias was for 100 seconds with methyl chloroform(90)/n-butanol(10) (weight).

4. The baking of the dry developed laminate was in an oven at 50° C. for 30 minutes.

5. The two-layer laminate was exposed for 10 seconds through a positive circuit line image in register.

6. After development the developed two-layer laminate was dried for 30 minutes at room temperature.

7. The developed laminate was pad toned using untreated Cerac® copper powder and was held for 5 minutes prior to removing excess copper powder by wiping with a wet towel and pat drying.

8. The bake step prior to ultraviolet radiation cure was omitted and the bake step after ultraviolet radiation cure was at 150° C. for 2 hours rather than for 20 minutes.

With the variation in composition of the lower layer and use of a different developer than disclosed in Example 1, a useful electrically conductive circuit with desired interconnections to the ground plane was obtained.

EXAMPLE 3

A photosensitive layer described in Example 2 was laminated to the baked circuit board as described in Example 2 and was exposed through a via target for 4 seconds using the Tamarack ®152R Exposure Unit described in Example 1. After removal of the silicone release polyethylene terephthalate film, the exposed laminate was dipped for 10 minutes into a developer containing 0.5% NaOH and 16.6% butyl carbitol at room temperature and while in the developer the surface of the laminate was brushed for an additional 5 minutes. After removal of the developed laminate from the developer, the laminate was air blown dry, oven baked at 150° C. for 3 minutes, and cooled to room temperature. The procedure in Example 2 was then followed to yield a useful electrically conductive circuit with desired interconnections to the ground plane.

EXAMPLE 4

A photosensitive layer was laminated to the baked circuit board as described in Example 2 and was exposed through a via target for 5 seconds using the Tamarack ®152R Exposure Unit described in Example 1. After removal of the silicone release polyethylene terephthalate film, a second photosensitive layer described in Example 1 was laminated to the surface of the first photosensitive layer as described in Example 1. The two-layer laminate was exposed for 10 seconds through a positive circuit line image in register with the via image using the Tamarack ®152R Exposure Unit. The polyethylene terephthalate film was removed, and the exposed two-layer laminate was developed for 110 seconds at room temperature in methyl chloroform(90)/n-butanol-(10) (weight). The unexposed areas of both the upper and lower photosensitive layers were removed. After the developed laminate was dried overnight, it was pad toned for 4 cycles using a mohair pad containing Cerac ® copper powder described in Example 2, wet towel washed to remove excess copper powder, and wiped dry. The two-layer laminate was cured by ultraviolet radiation using the Argus International device as described in Example 1. The ultraviolet radiation cured laminate was degreased by washing with a warm soapy solution, rinsed, immersed in 15% sulfuric acid solution, and rinsed as described in Example 1, followed by electrolessly plating also as described in Example 1. A useful electrically conductive circuit with desired interconnections to the ground plane was obtained.

EXAMPLE 5

A photosensitive layer, 0.002 inch (0.051 mm) thick, the composition set forth below was laminated to the cleaned baked circuit board as described in Example 1.

| Ingredient | Amount (parts) |
| --- | --- |
| Hexamethylene glycol diacrylate | 20.0 |
| Liquid butadiene/acrylonitrile copolymer (~16% acrylonitrile content) containing terminal acrylic-vinyl groups, (3.8%) low molecular weight, Brookfield viscosity at 27° C. is 250,000 cps | 20.0 |
| Rubber described in Example 1, lower layer | 56.0 |
| 2,2-dimethoxy-2-phenyl-acetophenone | 4.0 |
| Monastral Green ® pigment described in Ex. 2. lower layer | 0.1 |

The laminate was exposed through a positive via target for 7 seconds using the Tamarack ®152R Exposure Unit described in Example 1. The treated polyethylene terephthalate film was removed and the exposed laminate was developed for 100 seconds at room temperature in methyl chloroform(90)/n-butanol(10) (weight) developer. The developed laminate was air blown dried, baked in an oven at 150° C. for 3 minutes and cooled to room temperature.

A second photosensitive layer, 0.00015 inch (0.0038 mm) thick, of the below-listed composition having an electron discharge treated (0.07 coulomb/ft$^2$) polyethylene terephthalate film was laminated to the baked developed laminate using a Cromalin ® Laminator manufactured by E. I. du Pont de Nemours and Company at 190° F. (88° C.) and 6 feet (1.83 m)/minute.

| Ingredient | Amount (parts) |
| --- | --- |
| 1 Di-(3-methacryloxy-2-hydroxypropyl)-ether of bisphenol-A | 52.0 |
| 2 Polymethylmethacrylate, high molecular weight, inherent viscosity 1.25 | 41.4 |
| 3 (2-o-chlorophenyl-4,5-diphenyl imidazolyl) dimer | 2.2 |
| 4 2-(stilbyl-4")-(naphtho-1',2'4,5)-1,2,3-triazole-2"-sulfonic acid phenyl ester | 2.2 |
| 5 2-Mercaptobenzoxazole | 1.5 |

| Ingredient | Amount (parts) |
| --- | --- |
| 6 Polyethylene oxide, $\overline{M}_w$ is 600,000 | 0.7 |

The two-layer laminate was exposed for 10 seconds through a negative circuit line image in register with the via using the exposure source described above. The electron discharge treated polyethylene terephthalate film was removed at a fast rate at an angle of about 150°. The exposed areas of the upper photosensitive layer being removed therewith to reveal via pads and circuit lines. Unexposed areas of the photosensitive layer remained adhered to the lower photosensitive layer. The laminate was pad toned, excess copper powder was removed and the laminate was dried as described in Example 1. The toned laminate was baked in an oven at 150° C. for 3 minutes and ultraviolet radiation cured as described in Example 1, followed by baking in an oven at 150° C. for one hour. The ultraviolet radiation cured laminate was degreased by washing with a warm soapy solution, rinsed, immersed in 15% sulfuric acid solution, and rinsed as described in Example 1 followed by electrolessly plating also as described in Example 1. A useful electrically conductive circuit with via interconnections to the ground plane was obtained.

EXAMPLE 6

A photosensitive layer, 0.00185 inch (0.047 mm) thick, of the composition set forth below was laminated to cleaned baked circuit board as described in Example 1.

| Ingredient | Amount (parts) |
| --- | --- |
| 1 Methyl methacrylate/butadiene/ styrene terpolymer[1] | 10.2 |
| 2 Di-(3-acryloxy-2-hydroxy propyl)- ether of bisphenol-A | 42.3 |
| 3 Trimethylolpropane triacrylate | 2.2 |
| 4 Michler's ketone | 0.03 |
| 5 4-chlorobenzophenone | 3.97 |
| 6 Harwick #71 clay[2] | 26.4 |
| 7 Rubber described in Ex. 1, lower layer | 10.6 |
| 8 Methyl methacrylate resin[3] | 4.3 |

[1]white free flowing powder having a maximum of 0.3% volatiles; particle size distribution of maximum 10% on 45 mesh screen, maximum 10% through 325 mesh screen; specific gravity 1.0, sold under the trademark Acryloid ® KM-BTA-III-F by Rohm and Hass. Philadelphia. PA.
[2]high brightness clay having a chemical composition: $SiO_2$ (45.5%), $Al_2O_3$ (38.3%), $Fe_2O_3$ (0.3%), $TiO_2$ (1.5%), CaO (0.1%) $Na_2O$ (0.1%), $K_2O$ (trace), specific gravity of 2.58, average particle size 0.55 μm, oil absorption (ASTM D281-31) of 37 to 41, refractive index 1.56, pH 6.5 to 7.5 sold by Harwick Chemical Corp., Akron, Ohio.
[3]polymer medium molecular weight range, inherent viscosity of 0.45 when 0.25 g polymer is dissolved in 50 ml chloroform, measured at 25° C. using a No. 50 Cannon-Fenske viscometer, specific gravity (25°/25° C.) of 1.15, glass transition temp, (°C.) is 87, Tukon hardness (Knoop No.) is 17, acid No. is 0, sold under the trademark Elvacite ® 2009 Methyl Methacrylate Resins, E. I. du Pont de Nemours and Company, Wilmington, DE.

The laminate was exposed through a via target for 5 seconds using the Tamarack ®152R Exposure Unit described in Example 1. The treated polyethylene terephthalate film was removed, and the exposed laminate was developed for 90 seconds at room temperature on a Riston ® Model B Processor using methylchloroform. The developed laminate was allowed to room dry over the weekend. A second photosensitive layer, 0.00037 inch (0.009 mm) thick, of the below-listed composition having a polyethylene terephthalate film as described in Example 1 was laminated to the developed laminate at 2 feet/minute (0.61 m/minute) at about 103° C. in a Riston ®HRL-24 Laminator manufactured by E. I. du Pont de Nemours and Company, Wilmington, DE.

| Ingredient | Amount (parts) |
| --- | --- |
| Di-(3-acryloxy-2-hydroxypropyl)- ether of bisphenol-A | 31.1 |
| Trimethylolpropane triacrylate | 31.2 |
| (2-o-chlorophenyl-4,5-diphenyl- imidazolyl) dimer | 2.2 |
| 2-mercaptobenzoxazole | 1.5 |
| 2-(Stilbyl-4″)-naphtho-1′,2′:4,5)- 1,2,3-triazole-2″-sulfonic acid phenylester | 1.0 |
| Methyl methacrylate resin, Ex. 1, upper layer | 32.2 |
| Polyethylene oxide[1] | |

[1]water soluble resin having a weight average molecular weight of about 400,000 and a viscosity range at 25° C. of 2,250-3350 (5% solution) using a Brookfield viscometer Spindle No. 1 at 2 rpm commercially available as Polyox ® WSRN 3000, Union Carbide Corp., New York, NY.

The two-layer laminate was exposed for 2 seconds through a positive circuit line image in register with the via using the exposure unit described above. The exposed two-layer laminate was developed for 35 seconds at room temperature on Riston ® Model B Processor using methylchloroform. The developed two-layer laminate was baked in an oven at 150° C. for 6 minutes and while still hot was pad toned with Cerac ® copper powder described in Example 2. The toned laminate was allowed to cool to room temperature over a period of about 5 minutes. Excess copper powder was removed with a wet towel wash. The toned laminate was baked in an oven at 150° C. for 3 minutes, cured by ultraviolet radiation using the Argus International device as described in Example 1, and was baked in an oven at 150° C. for two hours. The ultraviolet radiation cured laminate was degreased by washing with a warm soapy solution, rinsed, immersed in 15% sulfuric acid solution, and rinsed as described in Example 1, followed by electrolessly plating also as described in Example 1. A useful electrically conductive circuit with desired interconnections to the ground plane was obtained.

EXAMPLE 7

A dry photosensitive layer of the composition set forth below, 0.002 inch (0.051 mm) thick, was laminated to the baked circuit board as described in Example 1.

| Ingredient | Amount (parts) |
| --- | --- |
| Methyl methacrylate/butadiene/ styrene terpolymer described in Example 6 (lower layer) | 13.1 |
| Methyl methacrylate(96%)/ethyl methacrylate(4%) inherent viscosity of 0.25 g polymer in 50 cc methylene chloride measured at 20° C. using a No. 50 Cannon-Fenske viscometer is 0.5 | 2.6 |
| Di-(3-acryloxy-2-hydroxypropyl)- ether of bisphenol-A | 43.9 |
| Trimethylolpropane triacrylate | 3.4 |
| Michler's ketone | 0.2 |
| 4-chlorobenzophenone | 3.9 |
| Monastral Green ® pigment described in Example 2, lower layer | 0.1 |
| Harwick ® 50R clay[1] | 26.2 |
| Rubber [3% carboxy-modified acrylonitrile(27)/butadiene(73)/] high molecular weight, average | 6.6 |

| Ingredient | Amount (parts) |
| --- | --- |
| Mooney viscosity is 45 | |

[1] water washed clay, G. E. brightness of 86.5 to 88.0, average particle size is 0.55 μm, pH 3.8 to 5.0, oil absorption (ASTM D-281-31) is 37.6 to 41.0, specific gravity of 2.58 sold by Harwick Chemical Corp., Akron, Ohio.

The silicone-treated polyethylene terephthalate film was removed, and a 0.0002 inch (0.005 mm) thick dry layer of the elastomeric composition described in Example 1 (lower layer) was laminated over the laminate. A silicone-treated polyethylene terephthalate film was present over the two-layer laminate. The laminate was exposed through a via target for 3 seconds using the exposure unit described in Example 1, and the silicone-treated polyethylene terephthalate film was removed. The exposed laminate was developed for 90 seconds at room temperature on a Riston ® Model B Processor manufactured by E. I. du Pont de Nemours and Company, Wilmington, DE using methylchloroform. The developed laminate was baked in an oven at 150° C. for 2 minutes. Onto the developed and baked laminate was laminated a 0.0003 inch (0.0076 mm) thick dry layer of a photopolymerizable composition described in Example 1 (upper layer) at 210° F. (~99° C.) and 6 feet (1.83 m)/minute. The photopolymerizable layer had on its outer surface a 0.0005 inch (0.013 mm) thick polyethylene terephthalate film. The laminate was exposed for 30 seconds through a positive circuit line image in register with the via using the exposure source described above. The polyethylene terephthalate film was removed and the exposed laminate was developed for 35 seconds in the processor as described above. The developed laminate was baked in an oven at 150° C. for 2 minutes to remove residual solvent and cooled to room temperature. The developed laminate was pad toned for 8 cycles as described in Example 1 using Cerac ® copper powder described in Example 2. Excess copper powder was removed by wiping clean with a wet towel and drying. The laminate was baked in an oven at 150° C. for 3 minutes and then ultraviolet radiation cured using an Argus International PC-7100 Ultraviolet Processor at 10 feet/minute (~3.05 m/minute) speed setting. The cured laminate was baked in an oven at 150° C. for two hours. The ultraviolet radiation cured laminate was degreased by washing with warm soapy solution, rinsed, immersed in 15% sulfuric acid solution; followed by a rinse in a water tank and a distilled water tank each for 30 seconds. The rinsed laminate was electrolessly plated for two hours as described in Example 1. A useful electrically conductive circuit with desired interconnections to the ground plane was achieved. This example illustrates that the laminate can be toned at room temperature to give good toner acceptance in image and via areas.

EXAMPLE 8

A dry photosensitive layer, 0.0018 inch (0.046 mm) thick, of the composition described in Example 6, lower layer, was laminated to the baked circuit board as described in Example 1. The laminate was exposed through a via target for 4 seconds using the exposure device described in Example 1, and the silicone treated polyethylene terephthalate film was removed. The exposed laminate was developed for 90 seconds at room temperature on a Riston ® Model B Processor manufactured by E. I. du Pont de Nemours and Company, Wilmington, DE using methylchloroform. The developed laminate was dried at room temperature for 30 minutes and baked in a oven at 150° C. for two minutes. Onto the developed and baked laminate was laminated in a Cromalin ® 2700 Laminator at 6 feet/minute (1.83 m/minute) at 190° F. (88° C.) a dry layer of the following composition which was coated on silicone treated polyethylene terephthalate at a dry coating weight of 24 mg/dm$^2$.

| Ingredient | Amount (g) |
| --- | --- |
| Cis-polybutadiene (Raw Mooney Typical Viscosity 40) | 480.0 |
| Random copolymer of styrene/butadiene (40/60) (Raw Mooney Typical Viscosity 34) | 120.0 |
| Tetra bis[methylene 3-(3',5'-di-t-buty-4'-hydroxyphenyl) propionate] methane | 3.0 |
| Methylene chloride | 5400.0 |

The silicone treated polyethylene terephthalate film was removed. Onto the surface from which the film was removed was laminated the photopolymerizable layer on an electron discharge treated polyethylene terephthalate film described in Example 5 (upper layer) by the procedure described in Example 5. The laminate was exposed for 4 seconds through a negative circuit line image in register with the vias using the exposure source described in Example 1. The electron discharge treated polyethylene terephthalate cover sheet was removed at an angle of about 90°. The exposed areas of the top photopolymer layer as well as the areas of the middle layer only over the vias were removed with the cover sheet. The laminate was pad toned at room temperature, excess copper powder was removed as described in Example 1. The toned laminate was baked in an oven at 150° C. for 3 minutes, ultraviolet radiation cured as described in Example 1, followed by baking in an oven at 150° C. for two hours. The laminate was cleaned as described in Example 1 and then electrolessly plated for two hours also as described in Example 1. A useful electrically conductive circuit with via interconnections to the ground plane was obtained. This example illustrates that when hot toning with metal powder is not desirable, the presence of a middle layer can make room temperature toning practical.

I claim:

1. A process for preparing a multilayer printed circuit having conductive interconnections which comprises:
    (a) laminating to a substrate bearing an electrically conductive surface or circuit pattern a layer of a photosensitive composition which is tacky or becomes tacky upon exposure, the layer optionally having a removable cover sheet;
    (b) exposing the laminate to actinic radiation through a via image which is related to the underlying circuit pattern if present leaving removable via image areas overlying at least one segment of the underlying conductive circuit pattern;
    (c) optionally removing the removable via image areas of the photosensitive layer in either the exposed or unexposed areas with a solvent therefor or peeling apart by removal of the cover sheet, if present:
    (d) laminating to the tacky photosensitive layer remaining from step (b) or step (c) a layer of a second photosensitive composition, the layer optionally having a removable cover sheet;

(e) exposing the laminate of step (d) to actinic radiation through a registered circuit image pattern which is related to the underlying circuit pattern having at least one segment thereof overlying at least one segment of the via image area resulting from step (b) and the underlying conductive circuit pattern to form an image surface having nontacky areas and removable circuit image areas;

(f) removing the removable circuit image areas of the photosensitive layer of step (d) in either the exposed or unexposed areas with a solvent therefor, or peeling apart by removal of the cover sheet, if present;

(g) removing the removable via image areas of the lower photosensitive layer, if present, with a solvent therefor;

(h) embedding finely divided metal, alloy, or plating catalyst material to the tacky image areas;

(i) optionally curing the laminate by exposing the laminate to actinic radiation, and/or heating;

(j) plating electrolessly the metallized or catalyzed vias, the uncovered segments, and overlying circuit image to form an electrically conductive circuit pattern interconnected with electrically conductive vias.

2. A process according to claim 1 wherein removing the unexposed areas of the photosensitive layers in steps (c) and (f) is by solvent development.

3. A process according to claim 2 wherein the same solvent removes the unexposed areas in the two photosensitive layers.

4. A process according to claim 1 wherein removing the exposed areas of the photosensitive layers in steps (c) and (f) is by solvent development.

5. A process according to claim 4 wherein the same solvent removes the exposed areas in the two photosensitive layers.

6. A process according to claim 1 wherein the unexposed areas of layer (c) are removed and the exposed areas of layer (f) are removed.

7. A process according to claim 1 wherein the exposed areas of layer (c) are removed and the unexposed areas of layer (f) are removed.

8. A process according to claim 6 wherein the unexposed areas of layer (c) are removed with a solvent therefor and the exposed areas of layer (f) are removed by peeling apart.

9. A process according to claim 6 wherein the unexposed areas of layer (c) are removed by peeling apart and the exposed areas of layer (f) are removed with a solvent therefor.

10. A process according to claim 1 wherein the unexposed areas of the photosensitive layer in step (c) are removed by peeling off the cover sheet, the unexposed areas adhering thereto.

11. A process according to claim 1 wherein the unexposed areas of the photosensitive layer in step (f) are removed by peeling off the cover sheet, the unexposed areas adhering thereto.

12. A process according to claim 10 wherein the unexposed areas of the photosensitive layer in step (f) are removed by peeling off the cover sheet, the unexposed areas adhering thereto.

13. A process according to claim 1 wherein the exposed areas of the photosensitive layer in step (c) are removed by peeling off the cover sheet, the exposed areas adhering thereto.

14. A process according to claim 1 wherein the exposed areas of the photosensitive layer in step (f) are removed by peeling off the cover sheet, the exposed areas adhering thereto.

15. A process according to claim 13 wherein the exposed areas of the photosensitive layer in step (f) are removed by peeling off the cover sheet, the exposed areas adhering thereto.

16. A process for preparing a multilayer printed circuit having conductive interconnections which comprises:

(a) laminating to a substrate bearing an electrically conductive surface or circuit pattern a layer of a tacky photopolymerizable composition optionally having a removable cover sheet;

(b) exposing the laminate to actinic radiation through a via image which is related to the underlying circuit pattern if present leaving removable via image areas overlying at least one segment of the underlying conductive circuit pattern;

(c) optionally removing the removable via image areas of the photopolymerizable layer with a solvent therefor or peeling apart by removal of the cover sheet, if present;

(d) laminating to the tacky photopolymerizable layer remaining from step (b) or step (c) a layer of a second photopolymerizable composition, the layer optionally having a removable cover sheet;

(e) exposing the laminate of step (d) to actinic radiation through a registered circuit image pattern which is related to the underlying circuit pattern having at least one segment thereof overlying at least one segment of the via image area resulting from step (b) and the underlying conductive circuit pattern to form an image surface having nontacky areas and removable circuit image areas;

(f) removing the removable circuit image areas of the photopolymerizable layer of step (d) with a solvent therefor, or peeling apart by removal of the cover sheet, if present;

(g) removing the removable via image areas of the lower photopolymerizable layer, if present, with a solvent therefor;

(h) embedding finely divided metal, alloy, or plating catalyst material to the tacky image areas;

(i) optionally curing the laminate by exposing the laminate to actinic radiation, and/or heating;

(j) plating electrolessly the metallized or catalyzed vias, the uncovered segments, and overlying circuit image to form an electrically conductive circuit pattern interconnected with electrically conductive vias.

17. A process according to claim 1 wherein the substrate bears an electrically conductive surface.

18. A process according to claim 1 wherein steps (a) to (j) are repeated at least once using the newly plated circuit pattern in step (j) for the succeeding process step (a).

19. A process according to claim 16 wherein steps (a) to (j) are repeated at least once using the newly plated circuit pattern in step (j) for the succeeding process step (a).

20. A process according to claim 1 wherein after removal of the removable image areas and prior to applying finely divided metal, alloy, or plating catalyst in step (h) the laminate is heated to a temperature up to 100° C.

21. A process according to claim 1 wherein the finely divided material is a metal powder, 1.0 to 250 μm in average diameter.

22. A process according to claim 21 wherein the metal powder is copper or a copper alloy.

23. A process according to claim 1 wherein any excess finely divided material is removed by washing.

24. A process according to claim 1 wherein after step (h) the metallized or catalyzed laminate is cured by heating to a temperature up to at least 150° C.

25. A process according to claim 1 wherein after step (h) the metallized or catalyzed laminate is cured by exposing the laminate overall to actinic radiation.

26. A process according to claim 1 wherein after step (h) the metallized or catalyzed laminate is cured by a combination of heating to a temperature up to at least 150° C. and by exposing the laminate overall to actinic radiation.

27. A process according to claim 2 wherein prior to exposing step (b) an intermediate elastomeric layer is laminated over the layer of tacky photosensitive composition.

28. A process according to claim 14 wherein the via image areas of the first photosensitive layer are removed with a solvent therefor in step (c) and prior to laminating a second layer of photosensitive composition in step (d), an intermediate elastomeric layer is laminated over the via image areas of the first photosensitive layer.

* * * * *